United States Patent
Ogura et al.

(10) Patent No.: US 7,447,077 B2
(45) Date of Patent: Nov. 4, 2008

(54) REFERENCING SCHEME FOR TRAP MEMORY

(75) Inventors: Tomoko Ogura, Hillsboro, OR (US); Nori Ogura, Hillsboro, OR (US); Seiki Ogura, Hillsboro, OR (US); Yoshitaka Baba, Beaverton, OR (US)

(73) Assignee: Halo LSI, Inc., Hillsboro, OR (US)

( * ) Notice: Subject to any disclaimer, the term of this patent is extended or adjusted under 35 U.S.C. 154(b) by 289 days.

(21) Appl. No.: 11/500,115

(22) Filed: Aug. 7, 2006

(65) Prior Publication Data

US 2007/0030745 A1 Feb. 8, 2007

Related U.S. Application Data

(60) Provisional application No. 60/706,178, filed on Aug. 5, 2005.

(51) Int. Cl.
G11C 11/34 (2006.01)

(52) U.S. Cl. .............................. 365/185.2; 365/185.28; 365/210.1

(58) Field of Classification Search ............... 365/185.2, 365/185.28, 185.21, 185.05, 185.18, 210.1
See application file for complete search history.

(56) References Cited

U.S. PATENT DOCUMENTS

| | | | |
|---|---|---|---|
| 4,785,423 A | 11/1988 | Skupnjak et al. | |
| 5,172,338 A | 12/1992 | Mehrotra et al. | |
| 5,386,388 A | 1/1995 | Atwood et al. | |
| 5,398,203 A | 3/1995 | Prickett, Jr. | |
| 5,544,116 A | 8/1996 | Chao et al. | |
| 5,596,527 A | 1/1997 | Tomioka et al. | |
| 5,629,892 A | 5/1997 | Tang | |
| 5,638,326 A | 6/1997 | Hollmer et al. | |
| 5,652,722 A | 7/1997 | Whitefield | |
| 5,754,475 A | 5/1998 | Bill et al. | |
| 5,771,192 A | 6/1998 | Kim et al. | |
| 6,038,169 A | 3/2000 | Ogura et al. | |
| 6,219,279 B1 | 4/2001 | Manolescu et al. | |
| 6,399,441 B1 | 6/2002 | Ogura et al. | |
| 6,587,380 B2 * | 7/2003 | Kanai et al. ............. | 365/185.28 |
| 6,809,963 B2 * | 10/2004 | Kanai ..................... | 365/185.05 |
| 6,829,165 B2 * | 12/2004 | Kanai ..................... | 365/185.11 |
| 6,906,951 B2 | 6/2005 | Wong | |
| 6,954,393 B2 | 10/2005 | Lusky et al. | |
| 6,975,541 B2 | 12/2005 | Shappir | |
| 6,992,932 B2 | 1/2006 | Cohen | |

* cited by examiner

Primary Examiner—Richard Elms
Assistant Examiner—Hien N Nguyen
(74) Attorney, Agent, or Firm—Saile Ackerman LLC; Stephen B. Ackerman

(57) ABSTRACT

A reference circuit is described for creating a reference signal using a twin MONOS memory cell. A first portion of the twin MONOS memory cell connects to a charged and floating bit line a current source formed in a second portion of the twin MONOS cell that discharges the charged bit line to form a reference signal for a sense amplifier. The sense amplifier compares the reference signal to a signal from a selected memory cell upon which memory operations are being performed comprising read, erase verify and program verify.

13 Claims, 4 Drawing Sheets

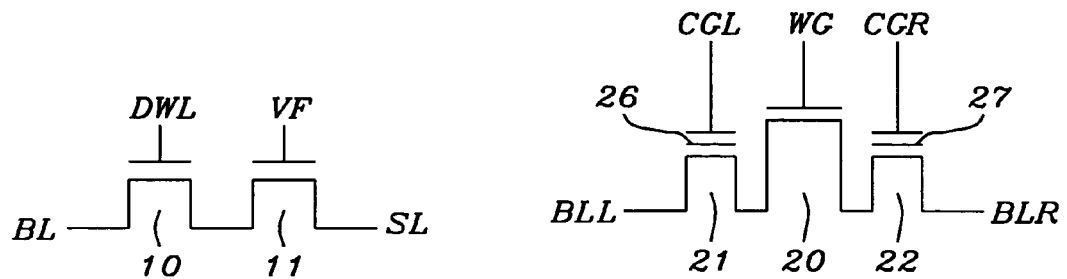
FIG. 1 - Prior Art
FIG. 2 - Prior Art
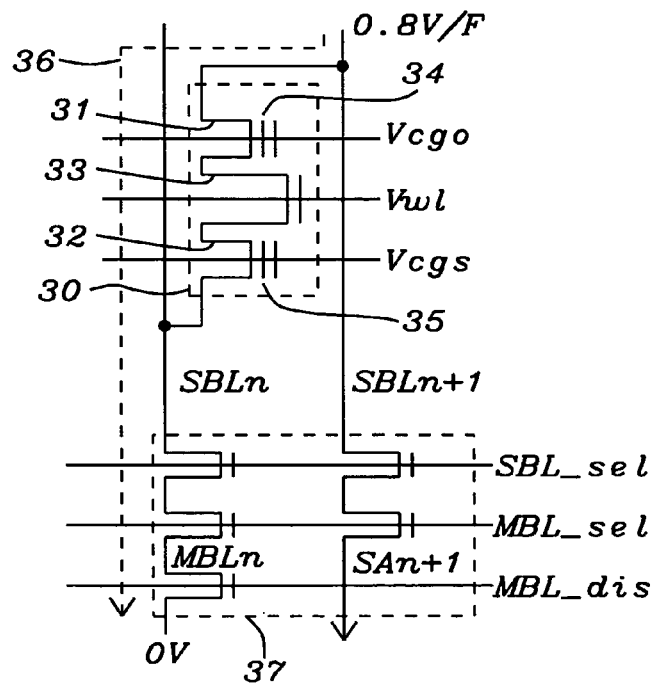
FIG. 3A

REFERENCING SCHEME FOR TRAP MEMORY This application claims priority to Provisional Patent Application Ser. No. 60/706,178, filed on Aug. 5, 2005, which is herein incorporated by reference in its entirety.

RELATED US PATENTS

This application is related to U.S. Pat. No. 6,038,369 (Ogura et al.), issued Mar. 14, 2000, and assigned to the same assignee as the present invention, and which is herein incorporated by reference in its entirety.

This application is related to U.S. Pat. No. 6,399,441 (Ogura et al.), issued Jun. 4, 2002, and assigned to the same assignee as the present invention, and which is herein incorporated by reference in its entirety.

BACKGROUND OF THE INVENTION

1. Field of Invention

The present invention is related to nonvolatile memories and in particular to the creation of a reference by which the state of Twin MONOS memory cells are evaluated.

2. Description of Related Art

To read data from a nonvolatile memory cell requires that a reference signal be produced to determine whether a signal by a cell being read is a logical "1" or a logical "0". A common method is to supply the reference signal to a differential sense amplifier to which the reference signal is connected to one input of the sense amplifier. In some cases the sense amplifier compares a bit line voltage to a DC reference voltage. This method can be slow because time is required to allow the bit line to settle. In other schemes a dynamic sensing method is used in which a half current is established to detect the difference between a logical "0" state and a logical "1" state. One challenge is to design a reference circuit, which can produce an output current or voltage that tracks current of a cell being read and can be used to accurately determine the logical state of the cell being read. In addition, the capacitive loading affects of a bit line containing the cell being read needs to be matched by the reference circuit to produce a similar performance between the memory cells and the reference circuit.

In U.S. Pat. No. 6,992,932 (Cohen) a method, circuit and system is directed to determining a reference voltage used to read memory cells that are programmed to a given program state. U.S. Pat. No. 6,954,393 (Lusky et al.) is directed to a method for reading a bit memory cell of a nonvolatile memory cell array. The method comprising a bit to be read and at least one other bit not to be read, and reading the bit to be read with respect to a multi-bit reference cell where the reference cell comprises a first bit at a first non-ground program state and a second bit at a second non-ground program state. U.S. Pat. No. 6,975,541 (Shappir) is related to reading array cell with matched reference cell where a voltage creates a read disturb and a programmed cell threshold voltage shifts upward allowing reference cell adjustment to keep on-off current ratio constant.

U.S. Pat. No. 6,906,951 (Wong) is directed to an auto-tracking bit line scheme that generates a half cell current by programming reference cells to threshold voltages that are between threshold voltages levels that are used to represent data. U.S. Pat. No. 6,219,279 (Manolescu et al.) is directed to a method and circuits in a nonvolatile memory system for limiting bit line current during program operation that includes biasing a driving transistor to mirror a maximum desired current. In U.S. Pat. No. 6,038,169 (Ogura et al.) a reference circuit is directed to producing a reference current to be used in determining the value of data in a flash memory cell. U.S. Pat. No. 5,771,192 (Kim et al.) is directed a bit line reference circuit for a nonvolatile memory device, which performs a reference data access operation using a single bit line having an upper and lower portion, wherein the upper bit line containing an upper reference cell provides a reference signal while a lower bit line cell string is selected.

U.S. Pat. No. 5,754,475 (Bill et al.) is directed to a reference scheme for a multi-bit flash memory in which multiple reference cells are arranged in rows and columns. The number of rows corresponds to the number of rows in the flash memory and the number of columns depends on the number of bits in the multi-bit memory cells. U.S. Pat. No. 5,652,722 (Whitefield) is directed to a floating gate transistor connected to a bit line and a bit line driver circuit comprising a variable impedance device and an active load powering the bit line from a supply node. U.S. Pat. No. 5,638,326 (Hollmer et al.) is directed to a flash memory read and verify circuit that minimizes by design the effects of process, power and temperature variations. The read and verify circuit uses a bias circuit with a cascode transistor for the reference. U.S. Pat. No. 5,629,892 (Tang) is directed to a flash memory where an array of reference cells is separate from the array of memory cells. The transconductance of the reference cells is matched to the transconductance of the memory cells to produce a reference current.

U.S. Pat. No. 5,596,527 (Tomioka et al.) is directed to a multi-bit flash memory with multiple reference cells providing a multiple of threshold voltages. The reference cells are made from memory cells, and the multiple reference cells associated with a word line of memory cells are accessed using the same word line as used for the memory cells. U.S. Pat. No. 5,544,116 (Chao et al.) is directed to a program and erase verify circuit in which different voltages are supplied to the memory and reference cells to read the program and erase verify conditions. U.S. Pat. No. 5,398,203 (Prickett, Jr.) discloses a nonvolatile memory device coupled to current regulating circuitry whereby the regulating circuitry regulates currents during programming. U.S. Pat. No. 5,172,338 (Mehrotra et al.) is directed to a set of reference cells which closely track the multi-bit flash memory cells are used for read and erase verification. In U.S. Pat. No. 4,785,423 (Skupnjak et al.) an architecture is directed to an EPROM PAL wherein sources of cells are coupled to a bit line through a current limiting transistor.

The stored value of a flash memory cell is usually determined by measuring its current or voltage signal with respect to a mid-way reference. In order to achieve both performance and reliability, it is desirable for the reference cell to be precisely controllable, and to match the memory cell characteristics as much as possible. In the first related U.S. Pat. No. 6,038,169 (assigned to the same assignee as the present invention) is described a reference cell, shown in FIG. 1, in which a memory cell 10 is connected in series with a current source 11. In this scheme, the reference current is primarily determined by the current source transistor 11, and the threshold of the memory cell portion 10 does not need to be precisely controlled. It is only necessary that the resistance of the memory cell 10 be significantly lower than the resistance of the current source. As a result of this configuration, a selected memory cell and an activated reference cell should experience the same turn-on delay and capacitive load. The accuracy of this scheme depends upon the current source transistor behaving similarly to the memory cell over variations in process, temperature and voltage.

If the behavior of the current source transistor does not track with the memory cell over variations of process, temperature and voltage, then a different approach is needed. There are several prior art in which a memory cell by itself is used for referencing. In U.S. Pat. No. 5,386,388 (Atwood et al.) is directed to using memory cells to generate the reference signal. In order to improve operation margin and reliability, different memory cells are used in the different modes of program verify and erase verify, as well as normal read.

Multiple program and erase operations, i.e. cycling, can also have a significant effect on memory cell transistor characteristics. In trap-type flash memory cells, threshold voltages may shift over time, or with increasing numbers of cycles. U.S. Pat. No. 6,992,932 (Cohen) is directed towards a dynamically adjustable reference based on taking a sample of known-cell values. In this scheme, it is expected that the programmed cell thresholds will shift down over time. It is assumed that the degree of threshold shift is the same for all of the memory cells; therefore, it is possible to sample a small number of cells to determine the degree of shift, find the appropriate reference level to correctly read those cells, and then apply that reference level to read the rest of the memory array.

In the second related U.S. Pat. No. 6,399,441 (assigned to the same assignee as the present invention) the Twin MONOS memory cell shown in FIG. 2 is described. The twin MONOS memory cell has two storage sites 26, 27 within a single cell device. A word gate device 20 is sandwiched between two control gate devices 21 and 22. In order to keep the storage regions independent from each other, a control gate override scheme is utilized. For example, when a selected side is read, the control gate of the unselected side is raised to a high voltage (override), and thus the state of the unselected side will have a negligible impact on the signal. However, in the event that the signal current itself is low, i.e. if both sides of the cell are programmed to high threshold states, the signal interference from the unselected side may become more significant.

SUMMARY OF THE INVENTION

It is an objective of the present invention to produce a reference signal using a twin MONOS memory cell containing two storage sites, wherein at least one of the two storage sites is programmed.

It is also an objective of the present invention to produce a reference signal using two twin MONOS memory cells connected in series on the same bit line, wherein at least one of the two storage sites in the reference signal determining twin MONOS memory cell is programmed.

It is further an objective of the present invention to provide a reference circuit, wherein a twin MONOS memory cell coupled to an NMOS current limiter transistor produces a reference signal, whereby the NMOS current limiter transistor determines the reference signal and the Twin MONOS memory cell acts as an on/off switch.

In the present invention a twin MONOS memory cell is used to create reference signals in one portion of a twin MONOS memory to be connected to a sense amplifier, which is measuring the response to memory operations being performed on an selected memory cell in another portion of the memory. There is at least one bit line connected to each sense amplifier that contains a twin MONOS memory reference cell to provide reference signals to the sense amplifier connected to that bit line.

In the preferred embodiment of the present invention a twin MONOS cell, previously described in FIG. 2, is used to integrate together in a single memory cell both functions of the reference circuit shown in FIG. 1, where a first portion of the twin MONOS reference cell is used primarily as a switch function to connect a reference signal to a bit line and then to a sense amplifier. A second portion of the twin MONOS reference circuit comprises a storage site that is used to create the reference signal. The storage site of the second portion is programmed to a threshold voltage value that is midway between the value of an erased storage site and a programmed storage site. The twin MONOS reference cell is selected with a word gate and the control gate of the first portion is coupled to an override voltage to connect the reference cell to a bit line and the reference input to a sense amplifier. The sense amplifier compares the reference signal to the results of a memory operation being performed on a memory cell in another portion of memory. During sensing, the voltage that is applied to the control gate of the second portion of the reference cell, which creates the reference signal, may be similar to, but not necessarily the same as, the voltage being applied to the control gate of the memory cell upon which a memory operation is being performed.

The memory operations comprise read, erase verify and program verify and each requires a different voltage value to be applied to the control gate of the second portion of the reference circuit. The timing of the voltages applied to the twin MONOS reference circuit is synchronized with those applied to the selected memory cell to assure that the reference signal concurrently arrives at the sense amplifier with the signal being received from the selected memory cell upon which a memory operation is being performed.

In a second embodiment of the present invention two twin MONOS memory cells are connected in series on a bit line to form a twin MONOS reference cell. The first of the two twin MONOS memory cells performs a switch function that connects a reference signal created by the second of the two memory cells to a bit line and a sense amplifier. At least one of the two storage sites of the second of the two reference memory cells is programmed to a threshold voltage value midway between the value of an erased and programmed storage site. Similar to the use of a single twin MONOS memory cell used to form a reference cell, the control gates of the first of the two twin MONOS reference cells are coupled to an override voltage to allow the reference signal resulting from the second of the twin MONOS reference cells to be connected to a bit line. Applied to the control gate over the programmed memory site are voltages that are similar or the same as applied to control gate of the addressed memory site that is receiving a memory operation, such as read, erase verify and program verify. An advantage of separating the switch function from the reference function is that if the control gates are switched in both the reference cell circuitry and the selected memory cell on which a memory operation is being implemented, then there will be a better timing between the reference signal and the response from the selected memory cell.

In a third embodiment of the present invention an NMOS reference transistor is connected to a twin MONOS memory cell, which has as a purpose connecting the reference signal from the NMOS reference transistor to a bit line and therefore to a sense amplifier. Both control gates of the twin MONOS memory cell are connected to an override voltage to allow passage of the reference signal to the sense amplifier. The advantage of this embodiment is that the reference transistor can be connected at different locations before and after control elements of bit line decoder circuits.

BRIEF DESCRIPTION OF THE DRAWINGS

This invention will be described with reference to the accompanying drawings, wherein:

FIG. 1 is a diagram of a reference circuit of prior art;

FIG. 2 is a circuit diagram of prior art of a twin MONOS memory cell;

FIG. 3A is a circuit diagram of the present invention, which combines a switching function and a reference function into a single twin MONOS memory cell;

DETAILED DESCRIPTION OF THE PREFERRED EMBODIMENT

Figure 3B:
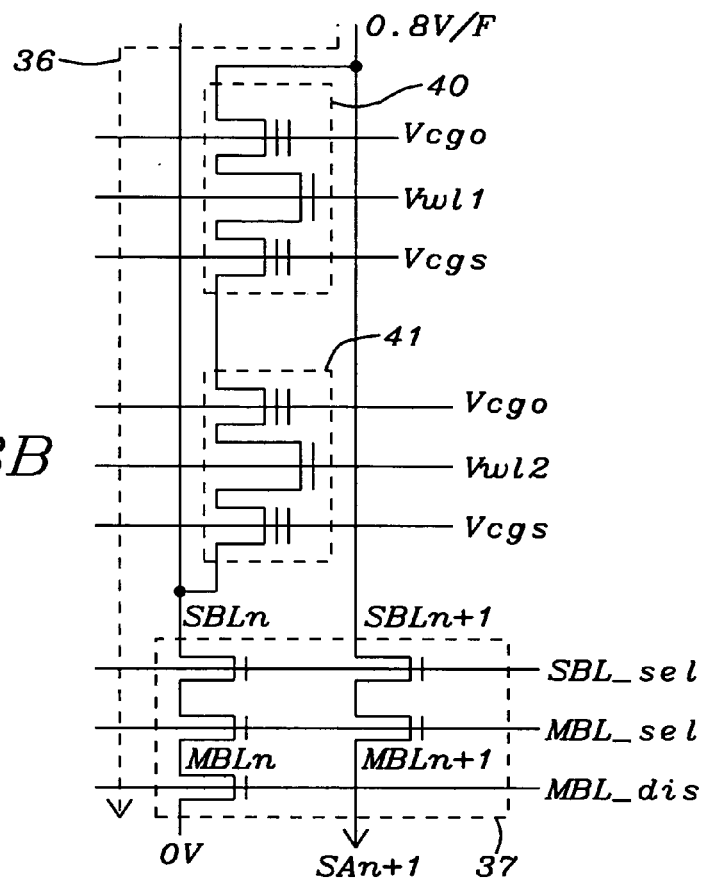
FIG. 3B is a circuit diagram of the present invention, which uses two twin MONOS memory cells to form a reference circuit.

In FIG. 3A is a circuit diagram of the preferred embodiment of the present invention showing the connection of a reference circuit formed by a twin MONOS memory cell 30 connected between sub-bit lines SBLn and SBLn+1, which are connected to bit line decoder circuits 37. The twin MONOS memory cell 30 is used to create a reference signal on bit line SBLn+1 connected to a sense amplifier SAn+1 through the bit line decoder circuits 37. The twin MONOS reference cell 30 comprises two storage devices 31 (override device) and 32 (reference device) and a word gate device 33 sandwiched between the two storage devices 31 and 32. The override device 31, used primarily as a switch function, is connected to a sub-bit line SBLn+1, which for example is charged to 0.8 volts and then floated. The reference device 32 is connected to 0V by a MBL_dis transistor connected to the main bit line MBLn in the bit line decoder 37. When the word gate device 33 is selected by a word line voltage Vwl, the override voltage VCGo is then connected to the gate of the override device 31, which switches on the override device allowing the reference device 32 to draw current from sub-bit line SBLn+1. As current 36 is drawn from the floated bit line SBLn+1, the value of the floated voltage drops creating a reference signal that is connected to a sense amplifier SAn+1 through the bit line decoder circuits 37. The sense amplifier SAn+1 uses the reference signal to compare to a signal from a selected memory cell in another portion of the twin MONOS that is connected to sense amplifier SAn+1. The storage site 34 of the override device 31 may or may not be programmed; however, in the first preferred embodiment the storage site 34 of the override device 31 is not programmed.

The storage site 35 of the reference device is programmed to a threshold voltage, which is between the threshold voltage of an erased storage site and a programmed storage site. The preferred programmed level of the storage site 35 is a value that is halfway between a threshold voltage for an erased and a programmed storage site. Different values of voltage Vcgs are connected to the gate of the reference transistor 32 depending on which memory operation is being performed on the selected memory cell in the other portion of memory and is connected to sense amplifier SAn+1. Program verify is performed on a selected twin MONOS memory cell in order to confirm that sufficient electron charge has been stored to the storage gate. Depending on whether the override transistor of the selected twin MONOS memory cell is programmed or erased, the reference program verify level is modulated.

When the selected Twin MONOS memory cell has both storage sites programmed, a significant decrease in current flows through the selected memory cell during a program verify operation as compared to that current when only one storage site is programmed. Current of the selected memory cell during program verify is small compared to other memory operations, and to accurately compensate for the difference in current in the selected memory cell, the Vcgs voltage applied to the control gate of reference transistor 32 is lowered to a value as shown in TABLE 1 under Program Verify B. In a first alternative approach the control gate voltages connected to the selected memory cell are set to values to compensate for the lower current resulting from both storage sites of the selected memory cell being programmed and the program verify A value is maintained regardless of the program condition of the two storage site in the selected transistor. In a second alternate approach the storage site 34 in the override device 31 is also programmed to a threshold value between that of an erased site and that of a programmed site, and the applied voltage Vcgs is maintained at the value used for the Program Verify A shown in TABLE 1. The problem with the second alternate approach is that the storage site 34 of override device 31 would require reprogramming each time a selected memory cell has two storage sites programmed, or a strategy would have to be created to program and program verify memory sites having only one storage site programmed separately from those sites which have only one storage site programmed and creating additional complexity.

The voltages shown in TABLE 1 (VCGo to the gate of the override device 31, VCGs to the gate of the reference device 32 and VWL to the word gate device 33), are applied to the reference circuit 30 in synchronization with the same or similar voltage being applied to the selected twin MONOS memory cell upon which a memory operation is being performed. As can be seen from TABLE 1 VCGs is a different voltage depending on which memory operation is performed on the selected memory cell. There are two program verify operations, PGM Verify A and PGM Verify B. This is caused by the affect that the override device of the selected memory cell has on the program verify results. If the override device in the selected memory cell has not been previously programmed, then PGM Verify A is used, and when the override device in the selected memory cell is programmed, PGM Verify B is used. The difference between PGM Verify A and B conditions is that the reference device current is higher for the PGM Verify A than program verify B. In this way, the effect of the state of the override side on cell current will be compensated, and more equal amounts of charge can be stored in the case that both sides of a memory cell are programmed. It should be noted that the voltage values shown in TABLE 1 and other places herein are examples for demonstrating the present invention and do not necessarily reflect the actual values that might be applied in an actual memory. Instead of modulating the Vcgs voltage of the reference cell, it is also possible to provide compensation for the state of the override side of the selected memory cell by varying the control gate voltage which is connected to the storage site of the selected memory cell upon which a memory operation is being performed. The variation in the applied control gate voltage is approximately in the order of 0.1-0.5V. Another approach is vary the control gate voltage which is connected to the override side of the selected memory cell, which would be significantly higher in value, approximately 1V or higher.

TABLE 1

| Node | Read | Erase Verify | PGM Verify A | PGM Verify B |
|------|------|--------------|--------------|--------------|
| CGs  | 1.8 V | 2.4 V | 1.0 V | 0.8 V |
| CGo  |      |       | 2.5 V |       |
| WL   |      |       | 1.5 V |       |

Shown in FIG. 3B is a schematic diagram of the second preferred embodiment of the present invention. This embodiment varies from the first embodiment in that there are a plurality twin MONOS memory cells connected in series, for example two memory cell 40 and 41 are shown, and connected between a charged bit line SBLn+1 and the decoder circuits, SBL_sel, MBL_sel and MBL_dis, on bit line SBLn. The override function is assigned to the upper memory cell 40 connected to the SBLn+1 bit line that has been charged to 0.8V and then floated, and the reference function is assigned to the lower memory cell 41, which is connected to 0V through the bit line decoder circuits 37. The threshold voltage of at least one of the storage sites in memory cell 41 is programmed to create the preferred reference cell current for the bit line voltage. Also voltages VCGo, VCGs and Vwl2 can be adjusted to generate the appropriate reference cell current to match the timing of the selected memory cell for which the reference signal is being generated as a reference for a sense amplifier.

Figure 4:
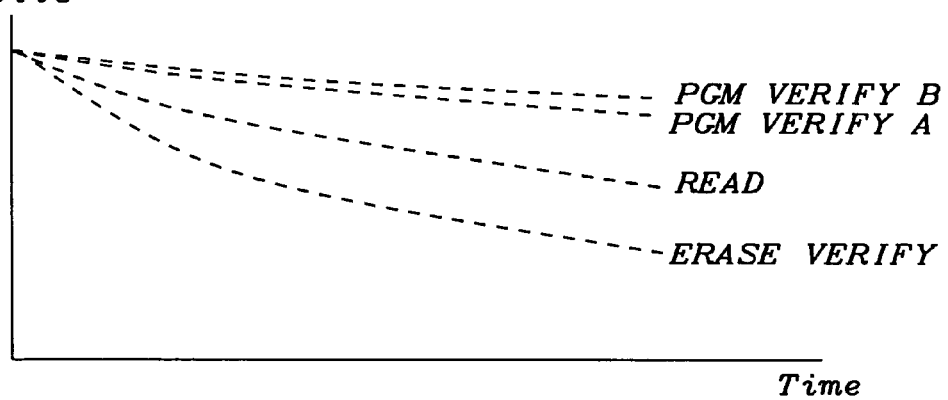
FIG. 4 is a diagram of the present invention showing signal response of a reference circuit to applied voltages for read and erase and program verify operations.

In FIG. 4 is shown bit line voltage as a function of time that is being modified by the reference circuit, which is pulling charge from the floating bit line such as SBLn+1. As can be seen the erase verify voltage generates a reference bit line signal that falls faster than a normal read signal. The program verify voltages generate reference bit line signals that falls much slower than the normal read signal since a much lower current is being is being created. In the dual bit reference cell, the state of the override transistor can affect the bit line signal, especially at the lower reference cell currents. Therefore two different program verify voltages are used, depending on whether the storage site of the override device of the selected Twin MONOS memory cell is programmed or not. If the override device is programmed, then the program verify condition B is used. If the override device is not programmed, then the program verify condition A is used. The difference between A and B conditions is that the reference cell current is higher for the A condition.

In FIGS. 5A-5D are shown variations of the third preferred embodiment where a twin MONOS memory cell 50 is used to connect an NMOS reference transistor 51 to a charged and floating bit line BLn+1. The use of the NMOS reference transistor 51 is appropriate when the transistor current source can track with the memory cell behavior over a wide range of variations in process and operation conditions and the reference transistor resistance dominates the current path so that resulting reference signal is controlled by the reference transistor.

Figure 5A:
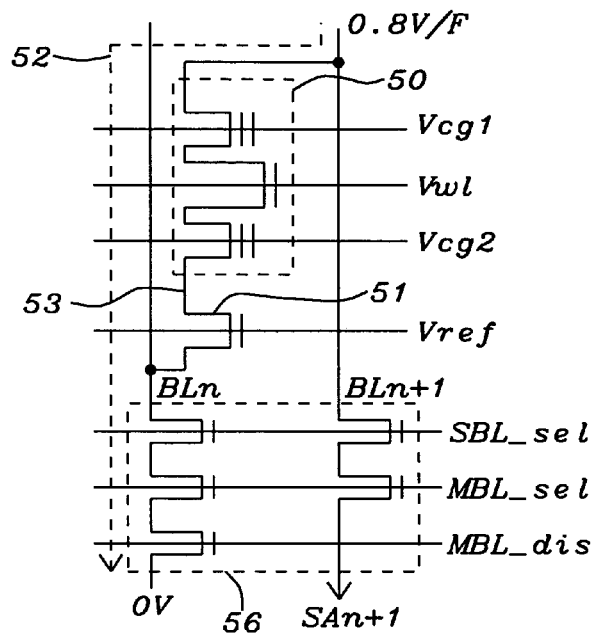
FIGS. 5A-5D is a circuit diagram of the present invention showing the use of an NMOS transistor as a reference device coupled to a switch formed from a twin MONOS memory cell.

In FIG. 5A a twin MONOS memory cell 50 containing two storage sites is used to connect a bit line voltage (0.8V and floating) to a reference transistor 51 to produce a reference current 52, which discharges bit line BLn+1 and creates a reference signal on bit line BLn+1 that is connected to sense amplifier SAn+1 through the bit line decoders 56. The reference signal is used by a sense amplifier SAn+1 for comparing to a signal from a selected twin MONOS memory cell on which memory operations are being performed. The current 52 of the reference cell is controlled by the reference voltage Vref, and the twin MONOS memory cell 50 works as an on/off switch connecting the floated voltage on BLn+1 to the reference transistor 51. The reference transistor 51 is connected to 0V through the bit line decoder 56. In order to match timing, the voltages applied to the twin MONOS memory cell 50, Vcg1, Vcg2 and Vwl are the same as the voltages applied to the selected read memory cell, which is located on a different bit line also connected to sense amplifier SAn+1. The layout implementation shown in FIG. 5A has a high level of complexity because the reference transistor 51 is required to be located inside of the memory array. However, it has the advantage that the intermediate node 53 has a small capacitance.

Figure 5B:
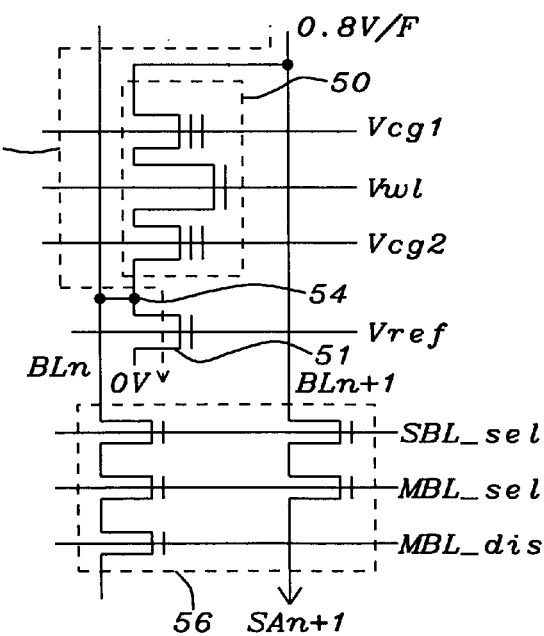

In FIG. 5B the reference transistor 51 is placed inside the sub bit line decoder and attached to the sub bit line BLn. However, the capacitance of the intermediate node 54 between the twin MONOS memory cell 50 and the reference transistor 51 is approximately double that of node 53 in the configuration shown in FIG. 5A. This extra capacitance requires consideration when choosing the order of the signal operation; however, the implementation of the layout is less difficult.

Figure 5C:
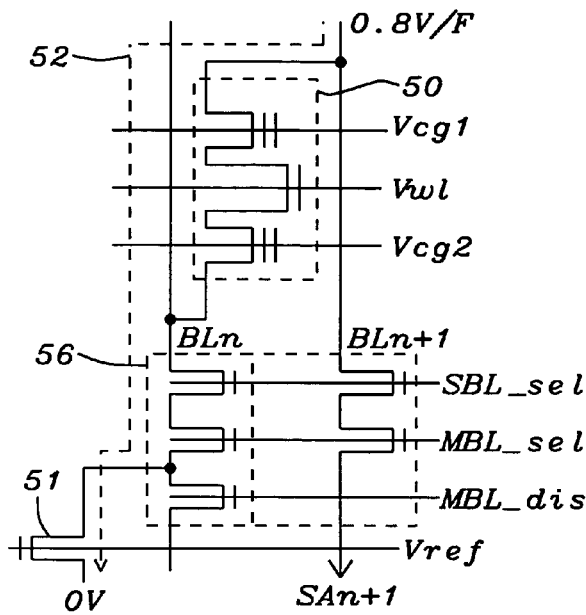

In FIG. 5C the reference transistor 51 is located after the second stage of the bit line decoding (main decode) of the bit line decoder 56. If the main bit line is long, then the capacitance between the reference memory cell transistor 50 and the reference transistor 51 may become significantly higher; however, if current sensing is used by the sense amplifier, or by carefully choosing the order of decode activation, the configuration in FIG. 5C can produce a feasible reference configuration.

Figure 5D:
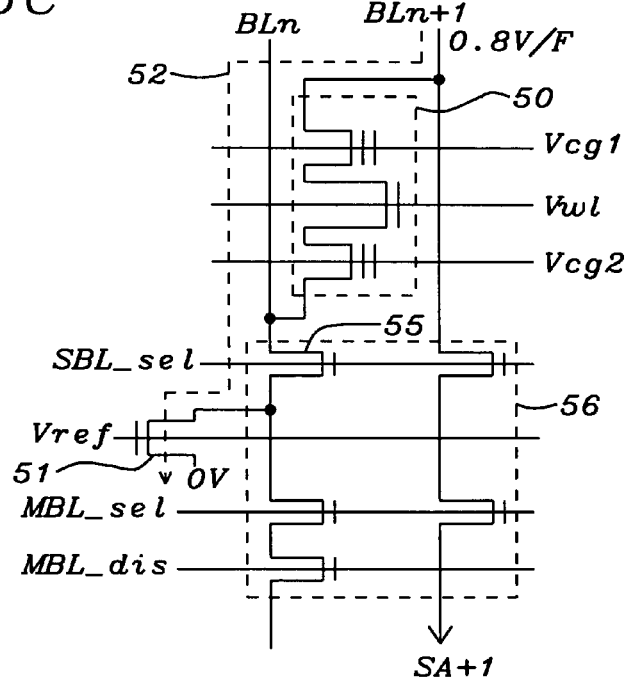

In FIG. 5D the NMOS reference transistor 51 is located after one stage of bit line decoding (sub-decode) 55; therefore, several bit lines may share the same reference transistor, which allows the layout to be relaxed more than with the configuration shown in FIG. 5B. The capacitance between the memory cell transistor 50 and the reference transistor 51 is approximately the same as the configuration shown in FIG. 5B with the addition of parasitic capacitance caused by the connected decode transistors 55.

It should be noted that the method and implementation noted herein is applicable to all nonvolatile memories requiring a reference signal for memory operations on a nonvolatile memory cell in which the memory operations comprise read, erase verification and program verification. An equivalent reference circuit to the twin MONOS reference circuit described herein, which provides a reference signal to a sense amplifier, is within the scope of the present invention. It is also within the scope of the present invention that either a reference voltage or a reference current can be supplied to a sense amplifier using the structure of an inactive portion of a nonvolatile memory including a memory comprising twin MONOS memory cells.

While the invention has been particularly shown and described with reference to preferred embodiments thereof, it will be understood by those skilled in the art that various changes in form and details may be made without departing from the spirit and scope of the invention.

What is claimed is:

1. A reference circuit for a twin MONOS memory, comprising:
   a) a plurality of reference circuits connected to a plurality of bit lines of a memory comprising twin MONOS memory cells, wherein said memory partitioned into a plurality of portions and wherein each reference circuit of the plurality of reference circuits comprises said twin MONOS memory cell having a first and a second storage site;

b) said first storage site programmed to a threshold voltage value between that of an erase state and a program state; and c) said reference circuit in a first portion of said plurality of portions providing a reference signal to a sense amplifier reading and verifying memory operations on memory cells in a second portion of said plurality of portions.

2. The circuit of claim 1, wherein said reference signal is compared to a signal from a selected memory cell in a sense amplifier to determine a value of a plurality of memory operations comprising erase verify, read and program verify operations, and wherein at least one storage site in said reference circuit is programmed to a threshold value between a value of an erased storage site and that of a programmed storage site, and wherein a plurality of control voltages connected to the reference circuit determines a plurality of currents to discharge a floating bit line connected to said reference circuit and to said sense amplifier to produce a reference signal for comparing to signals of said selected memory cell resulting from said memory operations.

3. The circuit of claim 2, wherein a control voltage of said plurality of control voltages connected to said reference circuit is decreased during said program verify operation to compensate for both storage sites of said selected memory cell being in a program state during said program verify operation.

4. The circuit of claim 2, wherein said selected memory cell is controlled by a select voltage whereby said select voltage is increased during program verify operation to compensate for a reduced current caused when both storage sites of said selected cell are programmed.

5. The circuit of claim 2, wherein said selected memory cell is controlled by an override control gate voltage that is increased during program verify operation when both storage sites of said selected memory cell are programmed.

6. A method for creating a reference for use in a twin MONOS memory, comprising:

a) designating a memory cell connected to a bit line of a twin MONOS memory as a reference cell, wherein said memory cell comprises a first and a second storage site, a first and a second control gate and a word gate;

b) programming said first storage site to a threshold voltage value between values of an erase state and a program state;

c) connecting memory operation dependent voltages to said first control gate thereby controlling a first portion of said reference cell containing said first storage site to produce a reference signal;

d) connecting an override voltage to said second control gate that controls a second portion of said reference cell containing said second storage site to allow said reference signal from said first portion to be connected to a bit line;

e) connecting a word line voltage to said word gate to select said reference cell; and f) connecting said reference signal to a sense amplifier whereby said sense amplifier uses said reference signal to evaluate a memory operation performed on a selected memory cell.

7. The method of claim 6, wherein said memory operation dependent voltages comprises control voltages for creating said reference signal for memory operations comprising read, erase verify and program verify.

8. The method of claim 6, wherein said reference signal for said program verify is decreased when a program verify operation is performed on a selected memory cell wherein both storage sites of said selected memory cell are programmed.

9. The method of claim 6, wherein said reference signal is formed by a current from said first portion whereby said current discharges said bit line that has been previously charged to a voltage and the floated.

10. A twin MONOS reference circuit, comprising:

a) a means for forming a reference circuit using a twin MONOS memory cell to combine a reference function and a control function into said twin MONOS memory cell thereby forming said reference circuit;

b) a means for connecting said reference circuit to a sense amplifier; and c) a means for changing a reference signal from the reference circuit connected to said sense amplifier dependent upon a memory operation being performed.

11. The reference circuit of claim 10, wherein the means for forming said reference circuit further comprises:

a) a means for providing said reference signal from a first portion of the reference circuit comprising a first control gate and a first storage site, wherein said first storage site programmed to a threshold value between an erase state and a program state; and b) a means for controlling connection of said reference signal to said sense amplifier through a bit line using a second portion of the reference circuit comprising a second control gate and a second storage site of said twin MONOS memory cell that forms the reference circuit.

12. The reference circuit of claim 11, wherein the means for providing said reference signal comprises discharging a charged and floating bit line coupled to a sense amplifier wherein said bit line voltage is said reference signal.

13. The reference circuit of claim 10, wherein the means for changing said reference signal is through the control of a control gate of the reference circuit to produce a plurality of current values, wherein each of said plurality of current values discharges a floated bit line to produce a reference signal connected to a sense amplifier for comparison to a signal from memory operations performed on a selected memory cell, wherein said memory operations comprising read, erase verify and program verify.

* * * * *